United States Patent
Kanetani et al.

(10) Patent No.: US 6,954,401 B2
(45) Date of Patent: Oct. 11, 2005

(54) SEMICONDUCTOR MEMORY DEVICE INTEGRATING SOURCE-COUPLED-LOGIC (SCL) CIRCUIT INTO AN ADDRESS BUFFER AND A DECODER

(75) Inventors: Kazuo Kanetani, Akishima (JP); Hiroaki Nambu, Sagamihara (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 11/023,395

(22) Filed: Dec. 29, 2004

(65) Prior Publication Data

US 2005/0111265 A1 May 26, 2005

Related U.S. Application Data

(62) Division of application No. 10/261,583, filed on Oct. 2, 2002, now Pat. No. 6,842,394.

(30) Foreign Application Priority Data

Oct. 15, 2001 (JP) .................................. P2001-316182

(51) Int. Cl.[7] .......................... G11C 8/18; H03K 19/20
(52) U.S. Cl. ............... 365/233.5; 365/233; 365/230.06; 365/230.08; 365/227; 365/189.08; 365/189.11; 365/194; 326/98; 326/95; 326/115; 326/108; 326/106
(58) Field of Search .......................... 365/189.08, 193, 365/191, 194, 203, 189.11, 233.5, 233, 230.06, 230.08, 227, 226; 326/93, 95, 98, 105, 106, 108, 115

(56) References Cited

U.S. PATENT DOCUMENTS

| 4,349,895 | A | 9/1982 | Isogai | 365/230.06 |
| 6,243,318 | B1 | 6/2001 | Yoshihara | 365/230.06 |
| 6,333,645 | B1 | 12/2001 | Kanetani et al. | 326/98 |
| 6,337,581 | B1 | 1/2002 | Kanetani et al. | 326/83 |
| 2004/0160850 | A1 * | 8/2004 | Son | 365/230.06 |
| 2005/0063243 | A1 * | 3/2005 | An | 365/230.06 |

FOREIGN PATENT DOCUMENTS

JP        10-150358       6/1998       ......... H03K/19/096

* cited by examiner

Primary Examiner—Andrew Q. Tran
(74) Attorney, Agent, or Firm—Miles & Stockbridge PC

(57) ABSTRACT

It is an object of the invention to provide a circuit configuration wherein a decoder control signal Φ2 is rendered unnecessary between an address buffer control signal Φ1 and the decoder control signal Φ2, thereby implementing speed-up in operation of a decoder circuit. The object is attained by adoption of a configuration wherein a buffer is integrated with a decoder, so that an output current path of transistors making up the address buffer, and that of transistors making up the decoder are connected with each other in series, thereby forming an output current path of decoder output. With the invention, speed-up in operation, lower power consumption, and higher cycle, of decoder circuits, can be achieved. Further, in the case of using the decoder circuits in a semiconductor memory, it is possible to achieve shortening of access time, lower power consumption, and higher cycle with reference to the semiconductor memory.

19 Claims, 10 Drawing Sheets

US 6,954,401 B2

SEMICONDUCTOR MEMORY DEVICE INTEGRATING SOURCE-COUPLED-LOGIC (SCL) CIRCUIT INTO AN ADDRESS BUFFER AND A DECODER

CROSS-REFERENCE TO RELATED APPLICATION

This application is a division of application Ser. No. 10/261,583 filed Oct. 2, 2002 now U.S. Pat. No. 6,842,394.

BACKGROUND OF THE INVENTION

1. Field of the Invention

The invention relates to a semiconductor integrated circuit (decoder circuit) suitable for speed-up in operation and lower power consumption, and a semiconductor memory using the same.

2. Description of the Prior Art

FIG. 12(a) shows a decoder circuit used in a semiconductor memory by way of an example of a conventional decoder circuit. The decoder circuit described above is disclosed in Japanese Patent Laid-open No. Hei10-150358. In FIG. 12(a), reference numerals XB0, XB1 indicate address buffers, A0, A1 indicate address inputs, N1 to N4 indicate inverters, VB0 to/VB1 indicate buffer outputs (or buffer output lines), XDE0 to XDE3 indicate decoders, output 0 to output 3 indicate decoder outputs (or decoder output lines) Φ1 indicates an address buffer control signal, and Φ2 indicates a decoder control signal. In the figure, a circuit configuration on the scale of four decoder output lines is shown by way of example. With the decoder circuit, a source-coupled-logic circuit (referred to hereinafter as a SCL circuit) is used for the address buffers and the decoders, and the decoder circuit has the following features. Firstly, buffer output signals (OR, NOR) have nearly equal delay time, respectively, and are suitable as inputs to the decoders. Secondly, even if the number of inputs to the decoders is large, the number of stacked stages of n-type transistors (MN1, MN2) for pull-down of an output section will not increase to more than two stages because the input transistors are connected in parallel in configuration. Hence, the decoder circuit is regarded a high-speed decoder circuit.

As shown in a timing chart of FIG. 12(b), however, a timing margin ts2 is required between the buffer outputs VB0 to/VB1 and the decoder control signal Φ2. The timing margin ts2 becomes a factor for blocking furtherance in speed-up of operation.

It is therefore an object of the invention to develop a circuit configuration wherein the decoder control signal Φ2 is unnecessary, thereby implementing speed-up in the operation of the decoder circuit.

SUMMARY OF THE INVENTION

According to a typical embodiment of the invention, a buffer is integrated with a decoder, so that an output current path of transistors making up the address buffer, and that of transistors making up the decoder are connected with each other in series, thereby forming an output current path of decoder output.

DETAILED DESCRIPTION OF THE PREFERRED EMBODIMENT

Figure 1A:
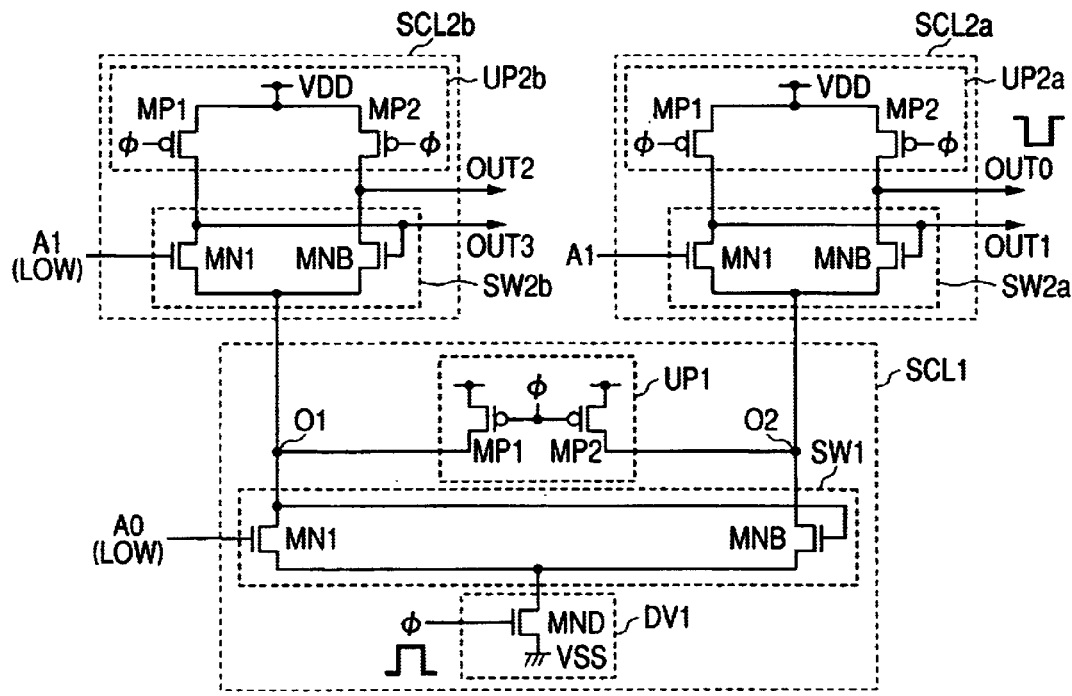
FIG. 1 shows a circuit diagram and a timing chart with reference to a first embodiment of the invention.
Figure 12A:
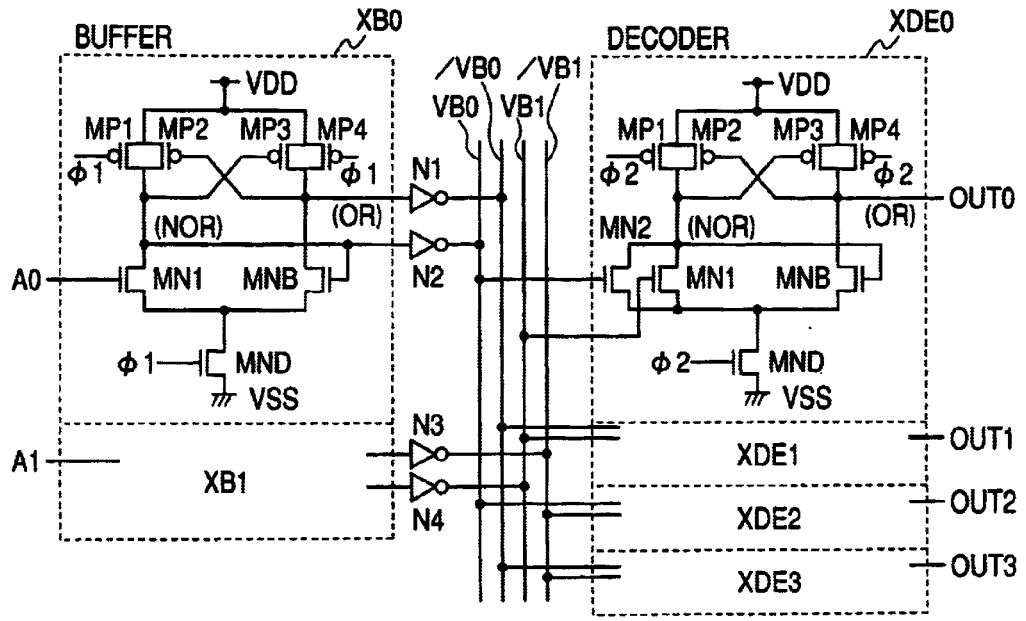
FIG. 12 is a circuit diagram showing an example of a conventional decoder circuit.
Figure 12B:
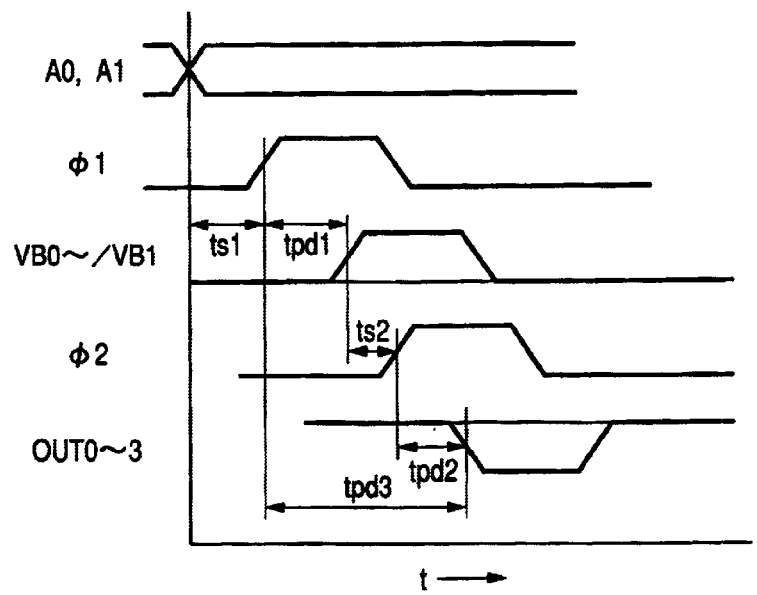

FIG. 1(a) shows a first embodiment of the invention. In the figure, reference numeral DV1 indicates an activation circuit, SW1 a switching circuit, and UP1 a pre-charge circuit, and a SCL circuit SCL1 in a first stage is made up of the DV1, the SW1, and the UP1 (for the SCL circuit, refer to the address buffers of the conventional circuit shown in FIG. 12). Further, a SCL circuit SCL2b in a second stage is connected to an output node 01 on one side of the SCL circuit SCL1 while another SCL circuit SCL2a in the second stage is connected to the other output node 02 of the SCL circuit SCL1 (however, neither the SCL2b nor the SCL2a comprises an activation circuit such as the DV1. The SCL1 acts as an activation circuit). Thus, the first embodiment has a configuration of stacked SCL circuits (series gate configuration). Symbol Φ indicates a control signal, and an address signal A0 is delivered to the SCL1 while an address signal A1 is delivered to the SCL2a and the SCL2b, respectively. Reference numerals OUT0 to OUT3 indicate decoder outputs, respectively. The present embodiment has a configuration for the case of decoding four outputs (OUT0 to OUT3) with the two address signals (A0, A1).

Figure 1B:
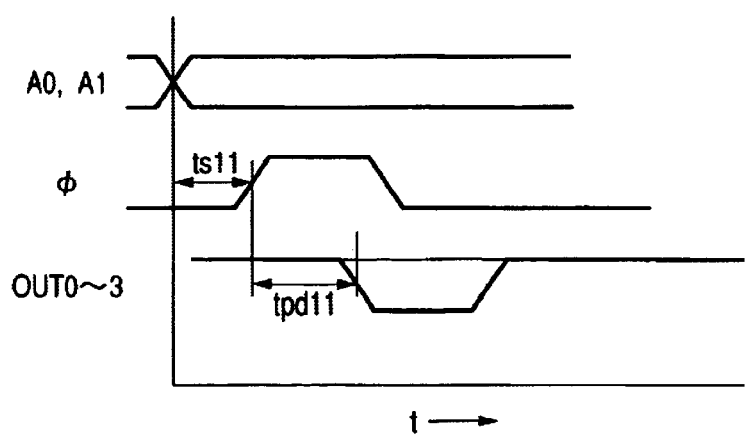

Referring to FIG. 1(a) and a timing chart of FIG. 1(b), a decoder operation is described hereinafter. When the control signal Φ is at a low potential (Low: VSS), an n-type transistor MND of the activation circuit DV1 is non-conducting while p-type transistors MP1, MP2, of the pre-charge circuits UP1, UP2a, UP2b, respectively, are conducting, so that the output nodes 01, 02, of the SCL1 and the decoder outputs OUT0 to OUT3 are all at a high potential (High: VDD). Next, an operation at the time when the control signal Φ is changed over from the low potential to the high potential is described hereinafter with an operational condition remaining as it is. First, the operation in the case of both the address signals A0, A1 being at the low potential is shown under items (1) to (3) described hereunder.

(1) The p-type transistors MP1, MP2, of the pre-charge circuits UP1, UP2a, UP2b, respectively, become non-conducting.

(2) The n-type transistor MND of the activation circuit DV1 becomes conducting. Because the potential at the output node 01 is higher than that of the address signal A0, a transistor MND of the switching circuit SW1 becomes conducting. Because the decoder output OUT1 is at a higher potential than the potential of the address signal A1, a transistor MNB of a switching circuit SW2a becomes conducting.

(3) That is, an output current path is formed by the above-described conducting transistors, but no other output current path is formed. As a result, only the decoder output OUT0 is changed over from the high potential to the low potential.

On the other hand, the operation in the case of both the address signals A0, A1 being at the high potential is shown under items (4) to (8) described hereunder.

(4) The p-type transistors MP1, MP2, of the pre-charge circuits UP1, UP2a, UP2b, respectively, become non-conducting.

(5) The n-type transistor MND of the activation circuit DV1 becomes conducting.

(6) Although the output node 01 is at the high potential at the outset (also, the transistors MN1, MNB of the switching circuit SW1 are both conducting at the outset), the potential of the output node 01 continues to drop because the transistor MN1 is conducting, finally causing the transistor MNB of the switching circuit SW1 to be non-conducting while the transistor MN1 thereof is conducting.

(7) Although the decoder output OUT3 is at the high potential at the outset (also, transistors MN1, MNB of a switching circuit SW2b are both conducting at the outset), the potential of the decoder output OUT3 continues to drop because the transistor MN1 is conducting, finally causing the transistor MNB of the switching circuit SW2b to be non-conducting while the transistor MN1 thereof is conducting.

(8) That is, an output current path is formed by the above-described conducting transistors, but no other output current path is formed. As a result, only the decoder output OUT3 is changed over from the high potential to the low potential.

As described above, one output current path is formed, thereby completing the decoder operation. Further, an operation in the case where the address signals A0, A1 are at other potentials will be similar to any of the above-described, omitting therefore description thereof.

Next, delay time is described. With the present embodiment, delay time from the control signal Φ to the decoder output is indicated by tpd11 in the timing chart of FIG. 1(b). Meanwhile, similar delay time of the conventional circuit is indicated by tpd3 in the timing chart of FIG. 12(b). The tpd 3 represents the sum of items (1) to (3) described hereunder.

(1) delay time (tpd1) from the control signal Φ1 to the buffer outputs (2) the timing margin (ts2) required between the buffer outputs and the control signal Φ2

(3) delay time (tpd2) from the control signal Φ2 to the decoder output

As a result of comparison (based on analysis made by the inventor, et al.) of both the delay times described above, the following relationship is found out $$tpd1 < tpd\ 11 < tpd\ 3$$

That is, as with the present embodiment, adoption of a configuration wherein buffers and decoders are integrated with each other will enable the ts2 and the tpd2 of the conventional circuit to be omitted, so that delay time can be shortened to an extent slightly longer than tpd1 of the conventional circuit.

Figure 2:
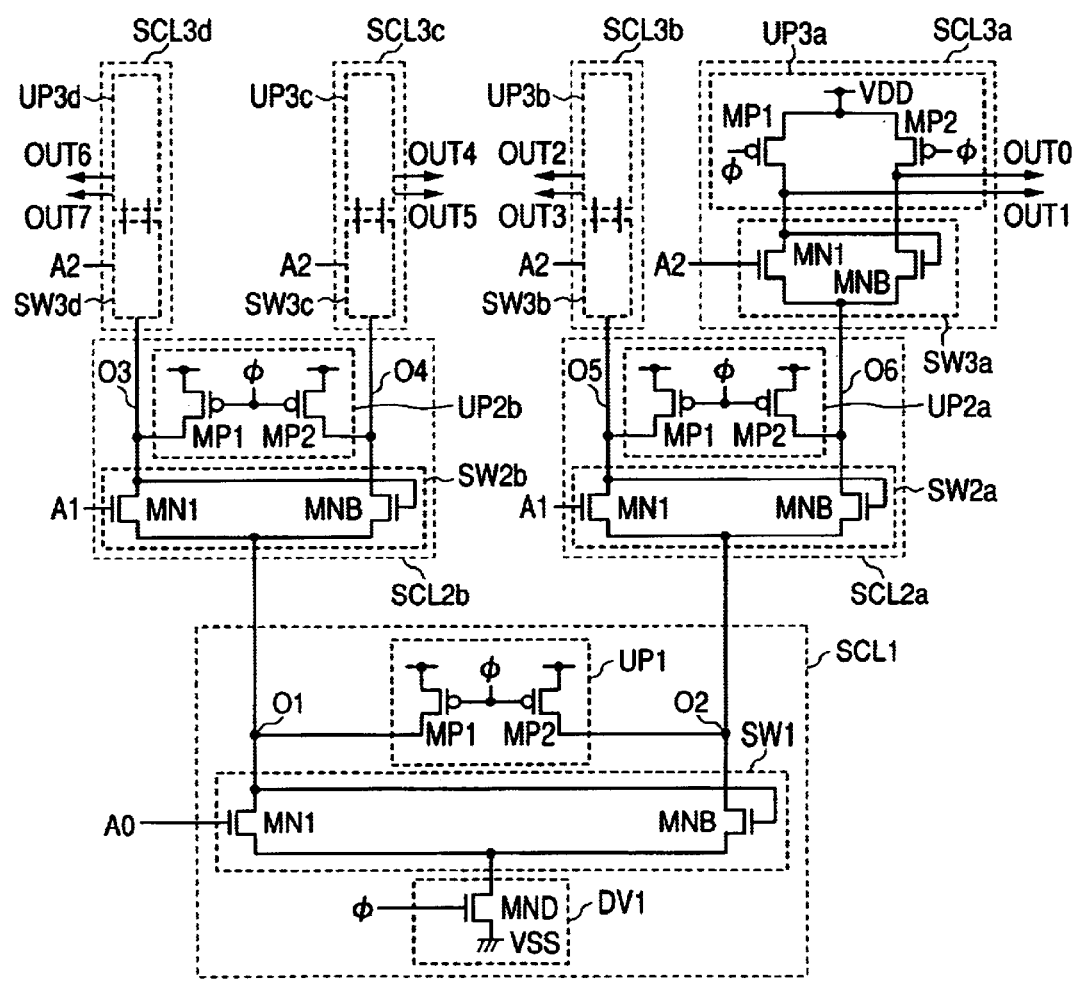
FIG. 2 is a circuit diagram showing a second embodiment of the invention.

FIG. 2 shows a second embodiment of the invention. The second embodiment differs from the first embodiment in that SCL circuits SCL3a to SCL3d in a third stage are further provided on top of the SCL circuits in the second stage, respectively, and an address signal A2 is delivered to the SCL circuits SCL3a to SCL3d, respectively. The present embodiment has a configuration for the case of decoding eight outputs (OUT0 to OUT7) with three address signals (A0 to A2). A decoder operation is similar to that according to the first embodiment, and one output current path is formed, thereby completing the decoder operation. Further, if this concept is similarly expanded, thereby adopting a configuration wherein SCL circuits in a fourth stage are further provided on top of the SCL circuits in the third stage, respectively, and an address signal A3 is delivered to the SCL circuits in the fourth stage, respectively, it is possible to obtain a configuration for the case of decoding sixteen outputs with four address signals (A0 to A3). Thus, with the decoder circuit according to the present embodiment, SCL circuits in "n" stages can be stacked and connected, thereby obtaining 2 raised to the n-th power in the number of decoded outputs.

Figure 3:
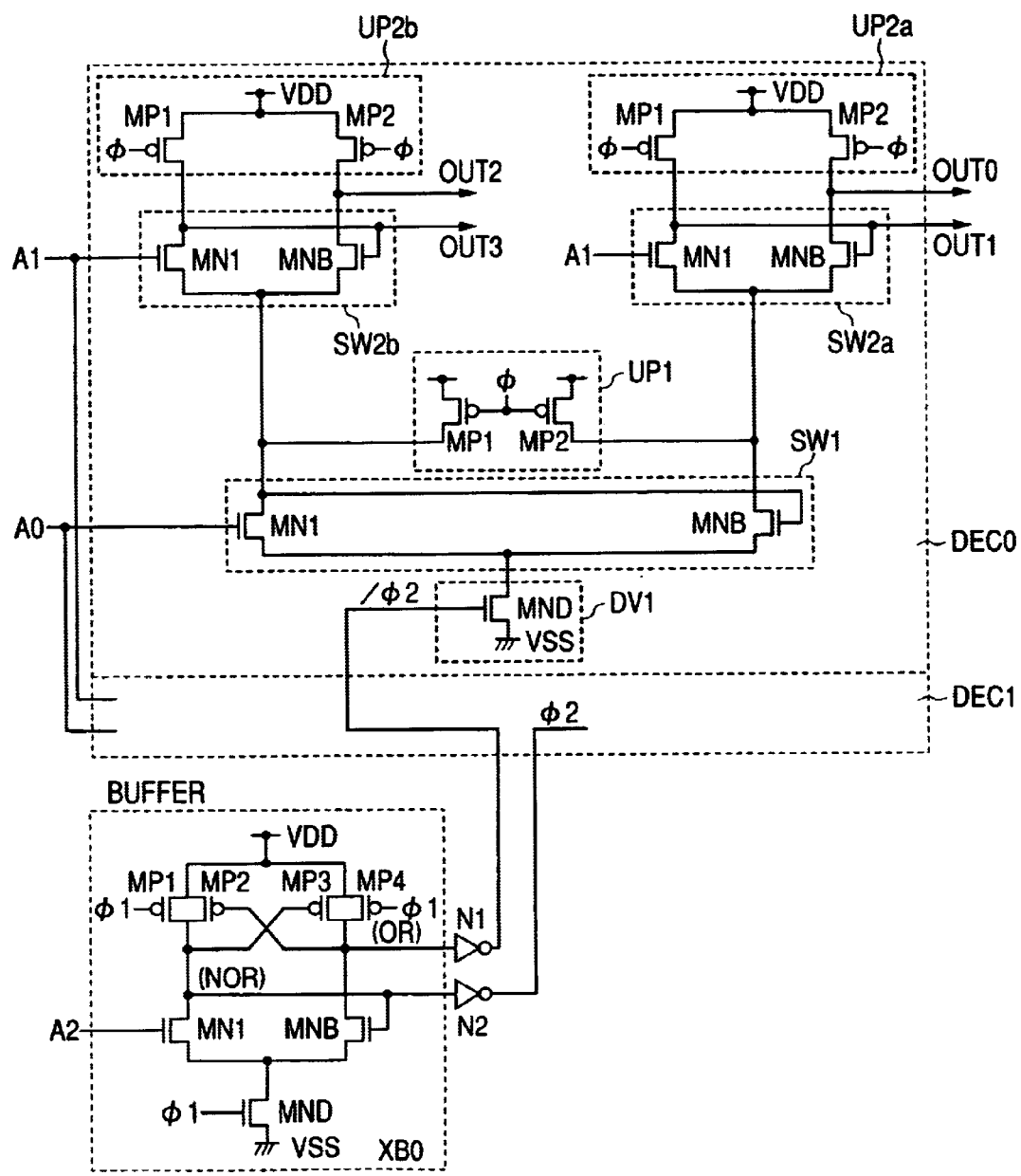
FIG. 3 is a circuit diagram showing a third embodiment of the invention.

FIG. 3 shows a third embodiment of the invention. With the present embodiment, there are provided two circuits (DEC0, DEC1), the same as the decoder circuits according to the first embodiment, and address signals A0, A1 are delivered thereto, respectively. Further, control signals (/Φ2, Φ2) are fed thereto from a buffer circuit to which an address signal A2 is delivered. The buffer circuit is a SCL circuit, and the control signals (/Φ2, Φ2) serve as complementary signals having nearly equal delay time, respectively. The configuration of the present embodiment is equivalent to that of the conventional circuit, and is suitable more for downsizing of an area than for shortening of delay time. Further, since the control signals (/Φ2, Φ2) of the decoder circuits are the complementary signals, when one of the decoder circuits is activated, the other is inactive, so that the present embodiment is suitable for achieving lower power consumption.

Figure 4A:
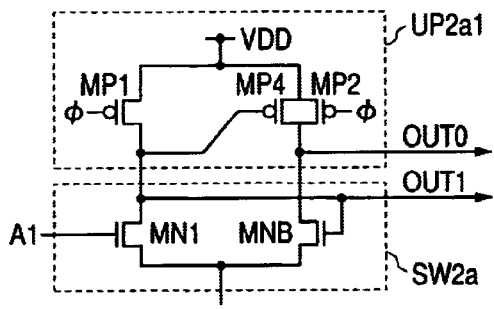
FIG. 4 is a circuit diagram showing a fourth embodiment of the invention.
Figure 4B:
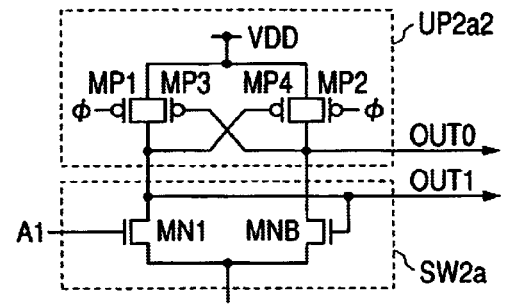

FIGS. 4.(a) and 4(b) show another pre-charge circuit according to a fourth embodiment of the invention, respectively. FIG. 4.(a) shows a configuration wherein a transistor MP4 for compensating for a potential level of a decoder output OUT0 is added to the pre-charge circuit shown in, for example, the first embodiment. As described under item (6) of the previously described decoder operation, a transistor MNB is changed over from the conducting condition to the non-conducting condition, and during such short time, the potential level of the decoder output OUT0 becomes slightly lower than the power source potential VDD with the potential level remaining as it is (floating condition). The transistor MP4 is added to cope with this problem. Because a decoder output OUT1 will be finally at a low potential, the transistor MNB becomes conducting, thereby charging the decoder output OUT0 up to the power source potential VDD (floating is prevented). FIG. 4.(b) shows a configuration wherein a transistor MP3 for compensating for a potential level of the decoder output OUT1 is further added. With such a configuration, if the potential of the decoder output OUT0 turns low in contrast with the case as described above, the transistor MP3 becomes conducting, thereby preventing the floating condition of the decoder output OUT1.

Figure 5:
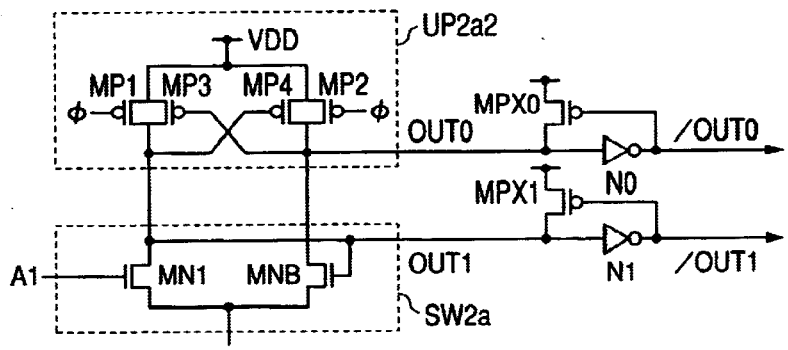
FIG. 5 is a circuit diagram showing a fifth embodiment of the invention.

FIG. 5 shows a fifth embodiment of the invention. The present embodiment is also suitable for prevention of floating at output nodes. The present embodiment has a configuration wherein an inverter N0 is connected to a decoder output OUT0, and an output of the inverter N0 is connected to the gate of a p-type transistor MPX0, so that floating of the decoder output OUT0 is prevented with the transistor MPX0 (the same configuration is provided on the side of a decoder output OUT1). In the case where the decoder output OUT3 is decoded in the first embodiment shown in FIG. 1, output current does not flow to the decoder outputs OUT0, OUT1, which will remain at the high potential, turning to the floating condition. With a configuration of the present embodiment, however, even in such a case, the outputs of the inverters N0, N1, respectively, are at the low potential, and the transistors MPX0, MPX1 become conducting, so that the floating of the decoder outputs OUT0, OUT1, respectively, can be prevented.

Figure 6A:
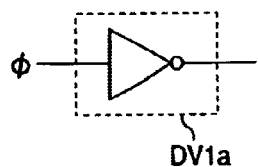
FIG. 6 is a circuit diagram showing a sixth embodiment of the invention.
Figure 6B:
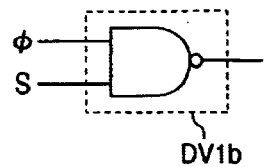

FIGS. 6(a) and 6(b) show a sixth embodiment of the invention. FIG. 6(a) shows an activation circuit DV1a made up of an inverter. An input to the activation circuit DV1a is connected to a control signal Φ while an output thereof is connected to a switching circuit SW1. Pre-charge time of output nodes is shortened by a p-type transistor of the inverter (refer to JP-A No. H10-150358). FIG. 6(b) shows an activation circuit DV1b made up of a NAND circuit having a plurality of inputs. With such a configuration according to the present embodiment, even in the case where the control signal Φ turns into activation condition (at the high potential), activation occurs only when all other inputs are at the high potential, and the activation circuit can be controlled so as to be inactive at other times, thereby reducing power consumption. It is evident that a multi-input logic circuit other than the inverter and the NAND circuit can also be used as an activation circuit.

Figure 7A:
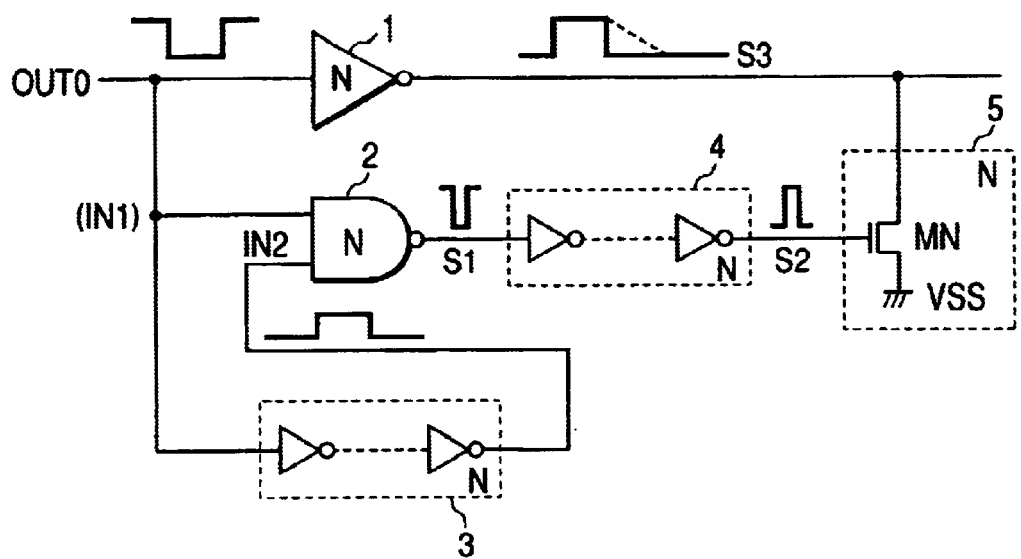
FIG. 7 shows a circuit diagram and a timing chart with reference to a seventh embodiment of the invention.
Figure 7B:
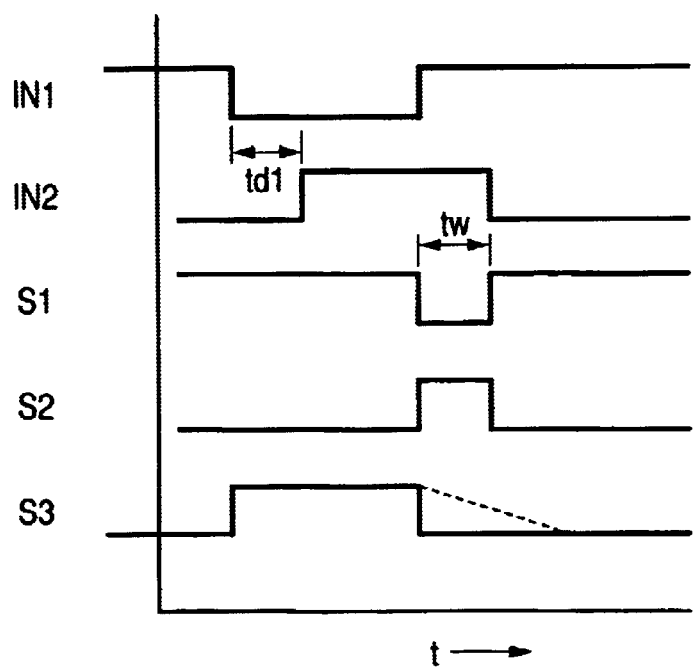

FIG. 7 shows a seventh embodiment of the invention. The present embodiment is an embodiment for shortening a pulse width of an output of an inverter N1 that receives an output of a decoder circuit (for example, OUT0), thereby enabling a high-speed cycle operation. It is assumed that the inverter N1 is designed such that a determination operation is executed at high speed in order to shorten delay time, and conversely, a pre-charge operation is executed at low speed. If there is provided only the inverter N1 under this condition, fall time of an output S3 thereof increases as shown by a broken line in FIG. 7(b), thereby increasing a pulse width. Therefore, it becomes difficult to shorten cycle time of the operations. In order to cope with this problem, the present embodiment has a configuration as shown in FIG. 7(a), wherein a NAND circuit N2, delay circuits N3, N4, and a second pre-charge circuit N5 are additionally provided (an element of a first pre-charge circuit is the same as an n-type transistor of the inverter N1). As shown in a timing chart of FIG. 7(b), with the present embodiment, a signal S1 is generated by the NAND circuit N2 on the basis of an input IN1 and an input IN2 that is an input after the input IN1 passing through the delay circuit N3. The signal S1 is generated at a timing corresponding to the back end edge of the input IN1, and may be a signal having a relatively narrow pulse width. Then, activation of an n-type transistor MN of the second pre-charge circuit N5 is effected with a signal S2 obtained from the signal S1 with polarity thereof, inverted by the delay circuit N4. Accordingly, a signal S3 from the inverter N1 has shorter fall time, a pulse width thereof becoming narrower. As a result, shortening of operation cycle time can be attained.

Figure 8A:
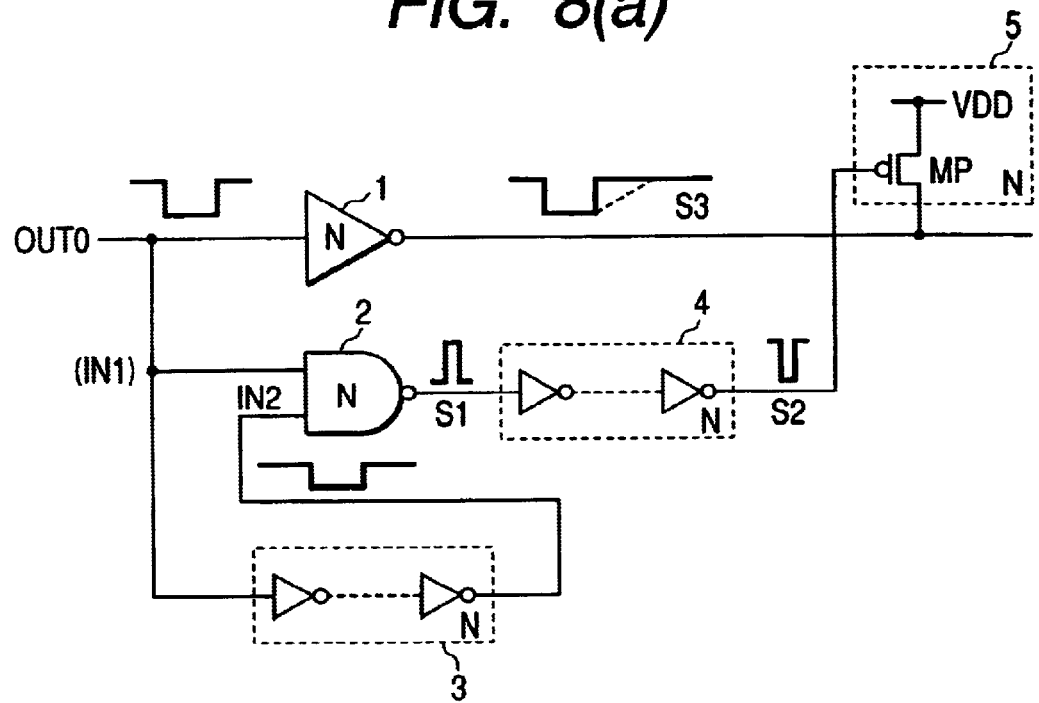
FIG. 8 shows a circuit diagram and a timing chart with reference to an eighth embodiment of the invention.
Figure 8B:
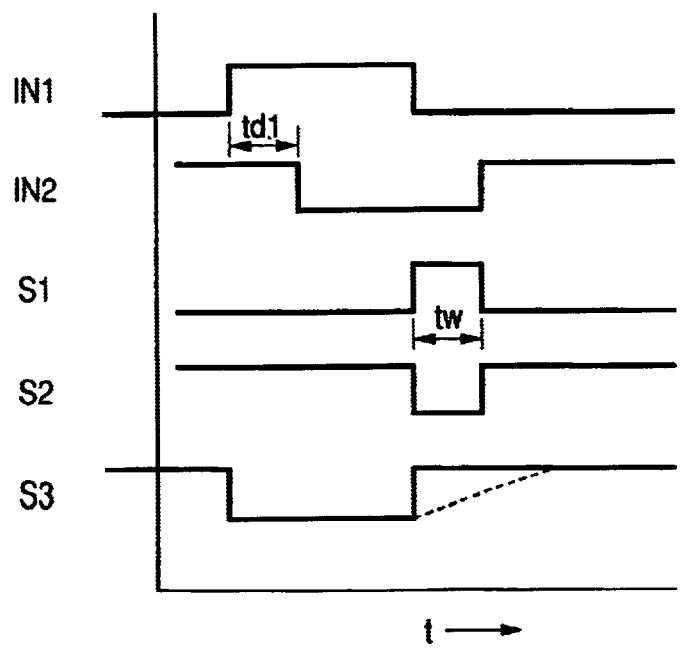

FIG. 8 shows an eighth embodiment of the invention. The present embodiment has a configuration for the case where the polarity of the input signal to the inverter N1 according to the seventh embodiment is reversed. Accordingly, the present embodiment has a configuration wherein a NOR circuit is substituted for the NAND circuit and a p-type transistor is substituted for the n-type transistor MN of the second pre-charge circuit N5. With the present embodiment as well, a signal S3 of the inverter N1 has shorter rise time due to the same operation (although the polarity of the signal is reversed) as that for the seventh embodiment described above, a pulse width thereof becoming narrower. As a result, shortening of the operation cycle time can be attained.

Now, an embodiment of a semiconductor memory using the decoder circuit is described hereinafter.

Figure 9:
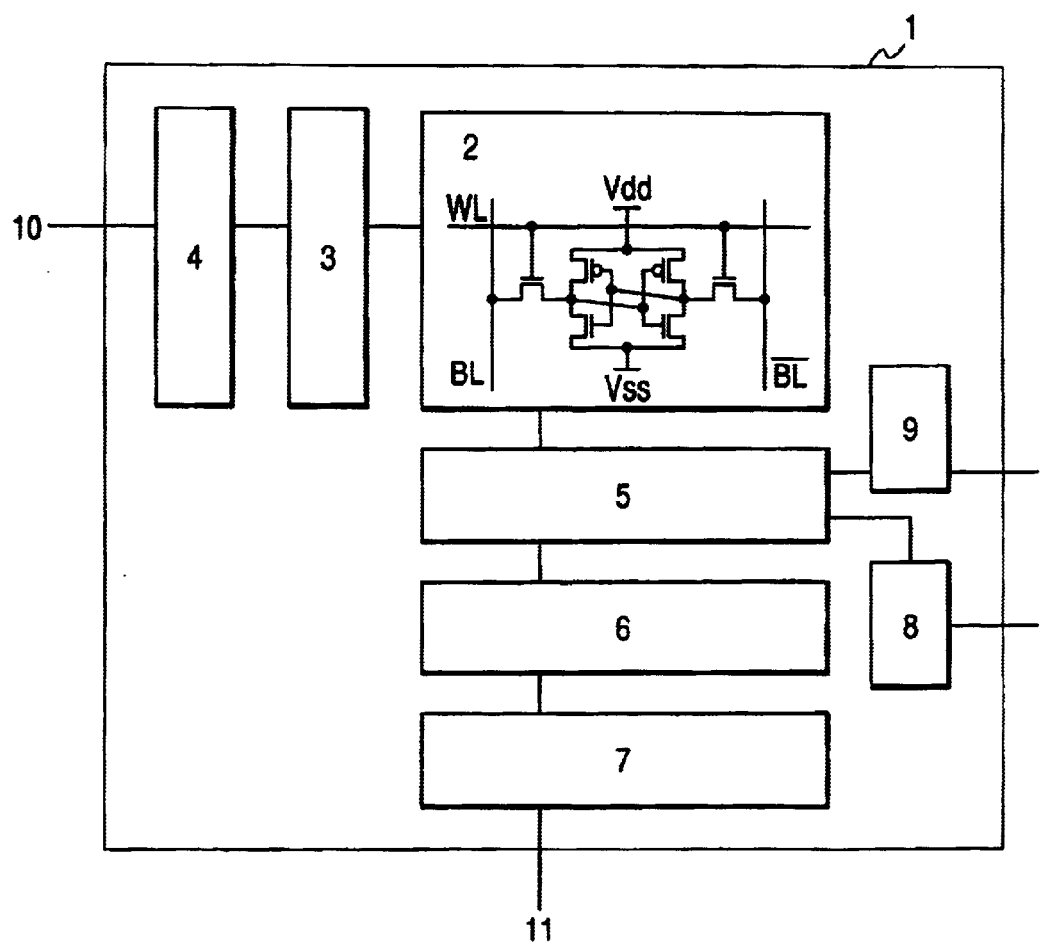
FIG. 9 is a block diagram showing a conventional semiconductor memory.

First, referring to FIG. 9, a conventional configuration is described. A semiconductor memory 1 comprises a memory cell array 2, a row decoder 3, a row address buffer 4, a sense circuit 5, a column decoder 6, a column address buffer 7, a read/write control circuit 8, and an output buffer 9. The memory cell array 2 is made up of an array comprised of a plurality of SRAM memory cells, comprising a multitude of the memory cells each with a memory cell selection terminal connected to a word line, and a data output terminal connected to a bit line, and the memory cells are disposed in a matrix pattern. The memory cells each comprise a flip-flop made up of a pair of CMOS inverters with an input of one being connected with an output of the other (made up of first and second p-channel load MOS transistors, and first and second n-channel drive MOS transistors) and first and second n-channel transfer MOS transistors connected between two memory nodes of the flip-flop and bit lines (BL, /BL), respectively. A word line WL is connected to the gate electrode of the respective n-channel transfer MOS transistors. The row address buffer 4 converts a row address signal 10 into an internal complementary address signal, which is decoded by the row decoder 3, driving a word line selected thereby to a selection level. The column address buffer 7 converts a column address signal into an internal complementary address signal, which is decoded by the column decoder 6. A bit line is selected depending on results of decoding by the column decoder 6. Thus, a memory cell as designated by the row address signal and the column address signal is selected.

Next, referring to FIG. 10, a configuration of an embodiment of a semiconductor memory is described hereinafter as a ninth embodiment of the invention. The present embodiment differs in configuration from the conventional one in respect of items (1) to (3) described hereunder.

(1) A decoder circuit 3B according to the invention is substituted for the row decoder 3 and the row address buffer 4, of the conventional configuration.

(2) A decoder circuit 6B according to the invention is substituted for the column decoder 6 and the column address buffer 7, of the conventional configuration.

Figure 10:
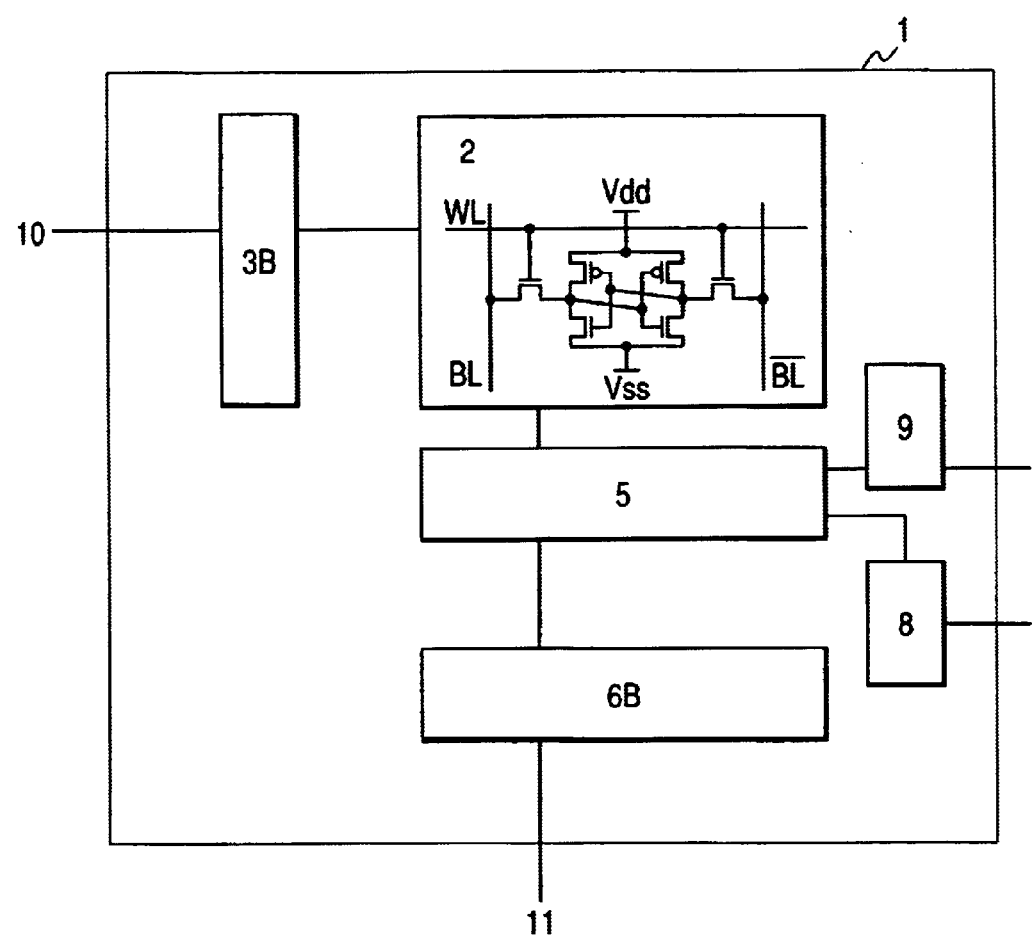
FIG. 10 is a block diagram showing a ninth embodiment of a semiconductor memory according to the invention.

(3) In FIG. 10, there is shown a configuration wherein the decoder circuits according to the invention are substituted for both the row decoder and the column decoder, however, only either of the row decoder and the column decoder may be replaced.

With such a configuration as described above, it becomes possible to attain shortening of access time, lower power consumption, and higher cycle with reference to the semiconductor memory. A variation to the present embodiment, wherein a p-type device is substituted for an n-type device, and an n-type device is substituted for a p-type device, is within a scope that can be readily presumed by those skilled in the art. Further, other field effect transistors may be used instead of the MOS transistors. Furthermore, there is no limitation to the number of stages of the inverters for use as buffers, decoders, and so forth provided that polarities of outputs are taken into consideration.

Figure 11:
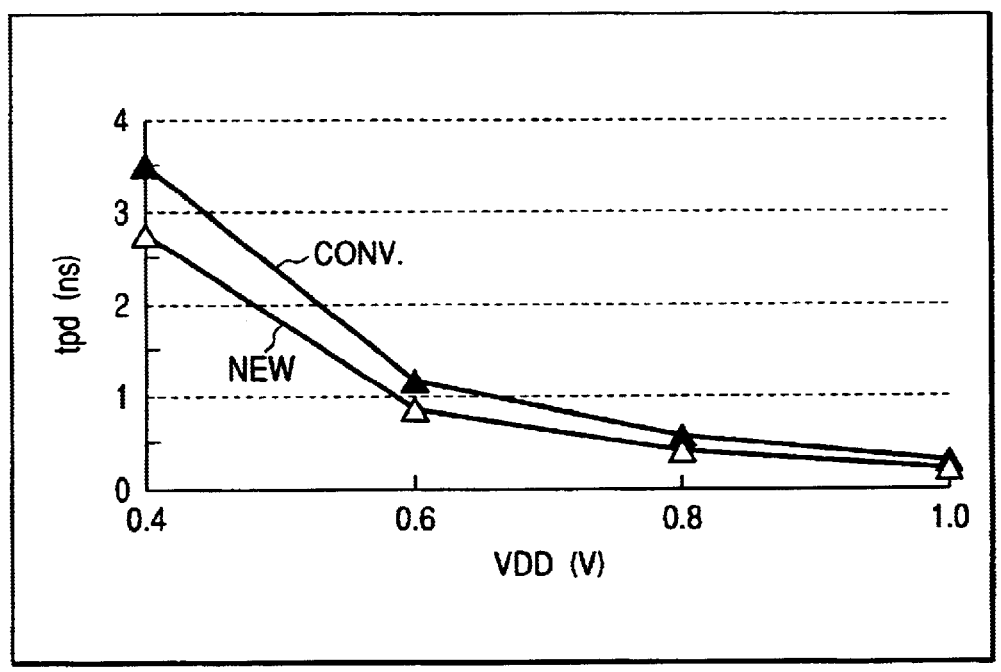
FIG. 11 is a chart showing performance of a conventional circuit, and that of the circuit according to the invention.

It has been generally regarded by those skilled in the art in the past that such circuits of stacked transistors as shown in the embodiments of the invention (for example, the first and second embodiments) have heavy delay time dependency on power-source voltage, and accordingly, is not suitable for low-voltage/high-speed LSIs. It has been presumed by the inventor et al., however, that adoption of the circuit according to the invention, wherein the buffer circuits and the decoder circuits are stacked, will reduce delay time to nearly half as compared with delay time in the case of employing the generally known conventional technique. It has been further presumed that the final value of an increase of delay time due to lowering of voltage might be rendered smaller that that of delay time in the case of employing the generally known conventional technique, thereby speeding up operation. Accordingly, computer simulation has been performed, whereupon it has been verified that presumption as described above is correct (refer to FIG. 11).

Thus, it is believed to be utterly impossible for others skilled in the art to develop the circuit according to the invention without an original presumption made by the inventor and et al. and the computer simulation based on the original presumption.

With the invention, speed-up in operation, lower power consumption, and higher cycle, of the decoder circuits, can be achieved. Further, in the case of using the decoder circuits in a semiconductor memory, shortening of access time, lower power consumption, and higher cycle can be implemented with reference to the semiconductor memory.

What is claimed is:

1. A semiconductor integrated circuit comprising:
    a first logic circuit receiving a first pulse signal as an input;
    a pre-charge circuit connected to an output of the first logic circuit; and
    a second logic circuit generating a second pulse signal based on the first pulse signal,
    wherein the pre-charge circuit is activated by the second pulse signal, and the second pulse signal is narrower in pulse width than the first pulse signal, being generated at a timing behind a back end edge of the first pulse signal.

2. The semiconductor integrated circuit according to claim 1, further comprising a address buffer and a decoder,
    wherein an output current path of transistors making up the address buffer, and that of transistors making up the decoder are connected with each other in series.

3. The semiconductor integrated circuit according to claim 2, further comprising an activation circuit and a plurality of pre-charge circuits,
    wherein a circuit formed by integrating the data buffer with the decoder comprises switching circuits in n stages, stacked and connected with each other, each having a first node formed by connecting the drain of an input transistor to the gate of a reference transistor, a second node served by the drain of the reference transistor, and a third node formed by connecting the source of the input transistor to the source of the reference transistor, said switching circuits in the respective stages being formed in the number of 2 raised to the (n−1)-th power such that the third node of each of a plurality of the switching circuits, in a n-th stage (the topmost stage), is connected to the first node or the second node of the respective switching circuits in a (n−1)-th stage, one terminal of the activation circuit the other terminal of which is connected to a first power source potential is connected to the third node of one of the switching circuits in a first stage (the bottom stage) the first node and the second node of the respective switching circuits in the first to n-th stages, respectively, are connected to each of the pre-charge circuits for pre-charging said nodes to a second power source potential, and the gate of the input transistor of the respective switching circuits in the first to n-th stages, respectively, receives a first to n-th input signal, respectively, a control signal being delivered to said activation circuit and pre-charge circuits, respectively.

4. The semiconductor integrated circuit according to claim 3,
    wherein the respective pre-charge circuits comprise one transistor, the control signal is delivered to the gate of the respective transistors, the second power source potential is connected to the source of the respective transistors, and the drain of the respective transistors is connected to the first node and the second node of the respective switching circuits in the first to n-th stages, respectively.

5. The semiconductor integrated circuit according to claim 3,
    wherein the respective switching circuits comprise a level compensatory transistor with a gate connected to the first node of the respective switching circuits, a drain connected to the second node of the respective switching circuits, and a source connected to the second power source potential.

6. The semiconductor integrated circuit according to claim 3,
    wherein the respective switching circuits at least in the topmost stage comprise a level compensatory transistor with a gate connected to the first node of the respective switching circuits, a drain connected to the second node of the respective switching circuits, and a source connected to the second power source potential.

7. The semiconductor integrated circuit according to claim 3,
    wherein the respective switching circuits comprise:
    a first level compensatory transistor with a gate connected to the first node of the respective switching circuits, a drain connected to the second node of the respective switching circuits, and a source connected to the second power source potential; and
    a second level compensatory transistor with gate connected to the second node of the respective switching circuits, a drain connected to the first node of the respective switching circuits, and a source connected to the second power source potential.

8. The semiconductor integrated circuit according to claim 3,
    wherein the respective switching circuits at least in the topmost stage comprise:
    a first level compensatory transistor with a gate connected to the first node of the respective switching circuits, a drain connected to the second node of the respective switching circuits, and a source connected to the second power source potential; and
    a second level compensatory transistor with gate connected to the second node of the respective switching circuits, a drain connected to the first node of the respective switching circuits, and a source connected to the second power source potential.

9. The semiconductor integrated circuit according to claim 3, wherein a first logic circuit and a first level holding circuit are connected to the first node of the respective switching circuits in the topmost stage, a second logic circuit and a second level holding circuit are connected to the second node thereof, and the first and second level holding circuits are controlled by an output signal of the first and second logic circuits, respectively, so that the first level holding circuit holds the first node of the respective switching circuits at the second power source potential while the second level holding circuit holds the second node of the respective switching circuits at the second power source potential.

10. The semiconductor integrated circuit according to claim 9, wherein the logic circuits each comprise an inverter, and the level holding circuits each comprise a level holding transistor with a gate connected to an output terminal of the inverter, a drain connected to an input terminal of the inverter, and a source connected to the second power source potential.

11. The semiconductor integrated circuit according to claim 3, wherein the activation circuit comprises one determination transistor with a source to drain path provided between one terminal and the other terminal of the activation circuit, a gate thereof being connected to the control signal.

12. The semiconductor integrated circuit according to claim 3, wherein the activation circuit comprises an inverter, and an input terminal thereof is connected to the control signal while an output terminal thereof is connected to the third node of one of the switching circuits in the first stage (the bottom stage).

13. The semiconductor integrated circuit according to claim 3, wherein the activation circuit comprises a multi-input logic circuit, any of multi-inputs being the control signal, with an output terminal thereof connected to the third node of one of the switching circuits in the first stage (the bottom stage).

14. The semiconductor integrated circuit according to claim 3, wherein the control signal is a signal based on an (n+1)-th input signal.

15. The semiconductor integrated circuit according to claim 2, wherein the semiconductor integrated circuit is activated with power source voltage not higher than 2V.

16. A semiconductor memory comprising a first logic circuit receiving a first pulse signal as an input;

a pre-charge circuit connected to an output of the first logic circuit; and a second logic circuit generating a second pulse signal based on the first pulse signal, wherein the pre-charge circuit is activated by the second pulse signal, and the second pulse signal is narrower in pulse width than the first pulse signal, being generated at a timing behind a back end edge of the first pulse signal.

17. The semiconductor memory according to claim 16, further comprising:

an address buffer;

a decoder; and a plurality of memory cells disposed at crossover points of word lines and bit lines, wherein an output current path of transistor of the address buffer, and that of transistors of the decoder are connected with each other in series.

18. The semiconductor memory according to claim 16, further comprising:

a plurality of memory cells disposed at crossover points of word lines and bit lines, a row decoder including an address buffer and a decoder; and a column decoder including an address buffer and a decoder, wherein output current paths of transistors of the respective address buffer and the respective decoder of each of the row decoder and the column decoder are connected with each other in series.

19. The semiconductor memory according to claim 17, wherein at least the address buffer and the decoder are activated with power source voltage not higher than 2V.

* * * * *